(12) United States Patent
Chen

(10) Patent No.: US 11,251,397 B2
(45) Date of Patent: Feb. 15, 2022

(54) DISPLAY PANEL HAVING DISPLAY AREA AND COMPONENT INSTALLATION AREA, METHOD OF FABRICATING DISPLAY PANEL HAVING DISPLAY AREA AND COMPONENT INSTALLATION AREA, AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventor: Jingjing Chen, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 448 days.

(21) Appl. No.: 16/340,180

(22) PCT Filed: Nov. 1, 2018

(86) PCT No.: PCT/CN2018/113450
§ 371 (c)(1),
(2) Date: Apr. 8, 2019

(87) PCT Pub. No.: WO2019/205554
PCT Pub. Date: Oct. 31, 2019

(65) Prior Publication Data
US 2021/0359255 A1   Nov. 18, 2021

(30) Foreign Application Priority Data

Apr. 28, 2018 (CN) .......................... 201810401636.5

(51) Int. Cl.
*H01L 51/52* (2006.01)
*H01L 51/56* (2006.01)

(52) U.S. Cl.
CPC ...... *H01L 51/5253* (2013.01); *H01L 51/5259* (2013.01); *H01L 51/56* (2013.01)

(58) Field of Classification Search
CPC ... H01L 51/5253–5256; H01L 51/5259; H01L 51/56
See application file for complete search history.

(56) References Cited

U.S. PATENT DOCUMENTS

| 2007/0159096 A1 | 7/2007 | Oh et al. |
| 2015/0021568 A1* | 1/2015 | Gong ................. H01L 51/5253 257/40 |

(Continued)

FOREIGN PATENT DOCUMENTS

| CN | 102983290 A | 3/2013 |
| CN | 104779200 A | 7/2015 |

(Continued)

OTHER PUBLICATIONS

International Search Report & Written Opinion dated Jan. 31, 2019, regarding PCT/CN2018/113450.

(Continued)

*Primary Examiner* — Shaun M Campbell
(74) *Attorney, Agent, or Firm* — Intellectual Valley Law, P.C.

(57) ABSTRACT

A method of fabricating a display panel having a display area and a component installation area substantially surrounded by the display area. The method includes forming one or more organic layers on a base substrate in both the display area and the component installation area; removing the one or more organic layers in at least a first region of the component installation area; forming an encapsulating material layer in at least the first region of the component installation area; and curing the encapsulating material layer.

12 Claims, 5 Drawing Sheets

(56) References Cited

U.S. PATENT DOCUMENTS

| | | | | |
|---|---|---|---|---|
| 2015/0171150 | A1* | 6/2015 | Ha | H01L 51/0017 |
| | | | | 438/34 |
| 2015/0372253 | A1* | 12/2015 | Hong | H01L 51/5253 |
| | | | | 257/40 |
| 2016/0276618 | A1* | 9/2016 | Sun | H01L 51/0029 |
| 2016/0300897 | A1* | 10/2016 | Song | H01L 51/004 |
| 2017/0162637 | A1* | 6/2017 | Choi | G09G 3/20 |
| 2017/0229674 | A1 | 8/2017 | Jin et al. | |
| 2018/0005568 | A1 | 1/2018 | Kim et al. | |
| 2018/0011373 | A1* | 1/2018 | Zhou | G02F 1/133528 |
| 2018/0342700 | A1* | 11/2018 | Cai | H01L 27/3262 |

FOREIGN PATENT DOCUMENTS

| | | |
|---|---|---|
| CN | 106601781 A | 4/2017 |
| CN | 106784377 A | 5/2017 |
| CN | 107248374 A | 10/2017 |
| CN | 107579094 A | 1/2018 |

OTHER PUBLICATIONS

First Office Action in the Chinese Patent Application No. 201810401636.5, dated Mar. 26, 2019; English translation attached.
First Office Action in the Chinese Patent Application No. 201810401636.5, dated Aug. 23, 2019; English translation attached.

\* cited by examiner

DISPLAY PANEL HAVING DISPLAY AREA AND COMPONENT INSTALLATION AREA, METHOD OF FABRICATING DISPLAY PANEL HAVING DISPLAY AREA AND COMPONENT INSTALLATION AREA, AND DISPLAY APPARATUS

CROSS-REFERENCE TO RELATED APPLICATION

This application is a national stage application under 35 U.S.C. § 371 of International Application No. PCT/CN2018/113450, filed Nov. 1, 2018, which claims priority to Chinese Patent Application No. 201810401636.5, filed Apr. 28, 2018, the contents of which are incorporated by reference in the entirety.

TECHNICAL FIELD

The present invention relates to display technology, more particularly, to a display panel having a display area and a component installation area substantially surrounded by the display area, a method of fabricating a display panel having a display area and a component installation area substantially surrounded by the display area, and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides a method of fabricating a display panel having a display area and a component installation area substantially surrounded by the display area, comprising forming one or more organic layers on a base substrate in both the display area and the component installation area; removing the one or more organic layers in at least a first region of the component installation area; forming an encapsulating material layer in at least the first region of the component installation area; and curing the encapsulating material layer.

Optionally, the encapsulating material layer is formed in the first region of the component installation area and in a peripheral area surrounding the display area; and the encapsulating material layer is cured to form an encapsulating layer encapsulating the display area.

Optionally, curing the encapsulating material layer is performed by laser curing.

Optionally, the component installation area comprises the first region and a second region substantially surrounded by the first region; and the encapsulating material layer is absent in the second region.

Optionally, removing the one or more organic layers in at least a first region of the component installation area comprises sintering the one or more organic layers in the first region of the component installation area.

Optionally, sintering the one or more organic layers in the first region of the component installation area is performed by laser sintering.

Optionally, prior to sintering the one or more organic layers in the first region of the component installation area, the method further comprises forming an absorbent layer for absorbing a decomposed material during sintering in at least the first region, the absorbent layer formed on a side of the one or more organic layers away from the base substrate and formed in at least the first region; and subsequent to sintering the one or more organic layers in the first region of the component installation area, the method further comprises removing the absorbent layer.

Optionally, the absorbent layer is formed by mechanically pasting a layer of absorbent material on a side of the one or more organic layers away from the base substrate in an inert atmosphere.

Optionally, removing the absorbent layer comprises dislodging the absorbent layer by applying a flow of an insert gas toward one or more lateral sides of the absorbent layer; and removing dislodged absorbent material of the absorbent layer by applying a vacuum suction on top of the absorbent layer.

Optionally, the absorbent layer comprises calcium oxide.

Optionally, the absorbent layer has a margin greater than 500 µm with respect to the first region.

Optionally, the absorbent layer has a thickness in a range of approximately 300 µm to approximately 500 µm.

Optionally, forming the encapsulating material layer in at least the first region of the component installation area comprises forming the encapsulating material layer on an encapsulating substrate; and assembling the encapsulating substrate with the base substrate from a side of the one or more organic layers away from the base substrate.

Optionally, the method further comprises forming one or more spacers on aside of the one or more organic layers away from the base substrate.

In another aspect, the present invention provides a display panel having a display area and a component installation area substantially surrounded by the display area, comprising a base substrate; one or more organic layers in at least the display area; and an encapsulating layer in at least a first region of the component installation area; wherein the one or more organic layers are substantially outside the first region.

Optionally, the encapsulating layer is in the first region of the component installation area and in a peripheral area surrounding the display area, thereby encapsulating the display area.

Optionally, the component installation area comprises the first region and a second region substantially surrounded by the first region; and the encapsulating layer is absent in the second region.

Optionally, the display panel further comprises an encapsulating substrate on a side of the one or more organic layers away from the base substrate.

Optionally, the display panel further comprises one or more spacers on a side of the one or more organic layers away from the base substrate, spacing apart the encapsulating substrate and the base substrate.

In another aspect, the present invention provides a display apparatus, comprising the display panel described herein or fabricated by a method described herein, and one or more integrated circuit

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
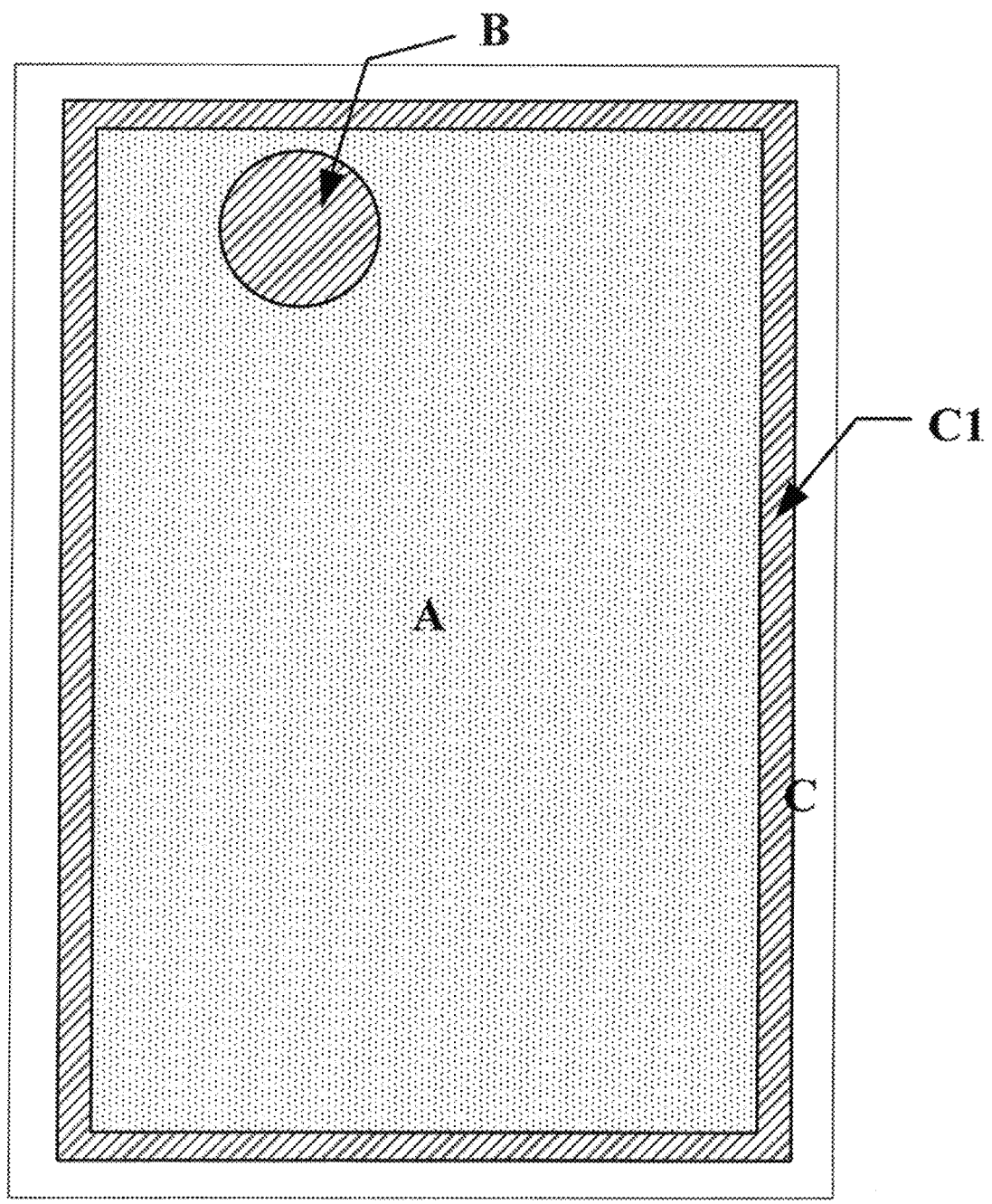
FIG. 1A is a schematic diagram illustrating the structure of a display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a display panel, particularly a display panel having one or more organic layers, an open mask process is frequently adopted to deposit the one or more organic layers on the substrate, in order to avoid color mixing problems. Because no mask plate is used during the open mask process, the organic layers are formed not only in display area, but also in component installation areas. Subsequently, boundaries of the component installation areas need to be sealed with an encapsulating material. It is discovered in the present disclosure that this presents an issue to achieving a satisfactory encapsulation of the display panel.

Accordingly, the present disclosure provides, inter alia, a display panel having a display area and a component installation area substantially surrounded by the display area, a method of fabricating a display panel having a display area and a component installation area substantially surrounded by the display area, and a display apparatus that substantially obviate one or more of the problems due to limitations and disadvantages of the related art. In one aspect, the present disclosure provides a display panel having a display area and a component installation area substantially surrounded by the display area. In some embodiments, the display panel includes a base substrate; one or more organic layers in at least the display area; an encapsulating layer in at least a first region of the component installation area. Optionally, the one or more organic layers is substantially outside the first region.

As used herein, the term "display area" refers to an area of a display panel where images are actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding to a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein, the term "component installation area" refers to an area of a display panel where a component (e.g., a lens of a camera) is installed, an area of the display panel reserved for future installation of an external component (e.g., a camera), or simply a dummy area. In the context of the present disclosure, the component installation area refers to an area of the display panel substantially surrounded by a display area of the display panel. Thus, a component installation area differs from a peripheral area of the display panel in that the peripheral area is an area substantially surrounding the display area whereas the component installation area is an area substantially surrounded by the display area.

As used herein the term "peripheral area" refers to an area of a display panel where various circuits and wires are provided to transmit signals to the display panel. To increase the transparency of the display apparatus, non-transparent or opaque components of the display apparatus (e.g., battery, printed circuit board, metal frame), can be disposed in the peripheral area rather than in the display area.

As used herein, the term "substantially surrounded" refers to at least 50% (e.g., at least 60%, at least 70%, at least 80%, at least 90%, at least 95%, at least 99%, and 100%) of a perimeter of an area is surrounded. As used herein, the term "substantially surrounding" refers to surrounding at least 50% (e.g., at least 60%, at least 70%, at least 80%, at least 90%, at least 95%, at least 99%, and 100%) of a perimeter of an area.

FIG. 1A is a schematic diagram illustrating the structure of a display panel in some embodiments according to the present disclosure. Referring to FIG. 1A, the display panel in some embodiments has a display area A and a component installation area B, the component installation area B substantially surrounded by the display area A. In some embodiments, the display panel additionally includes a peripheral area C substantially surrounding the display area A. The peripheral area C includes a C1 region.

Figure 1B:
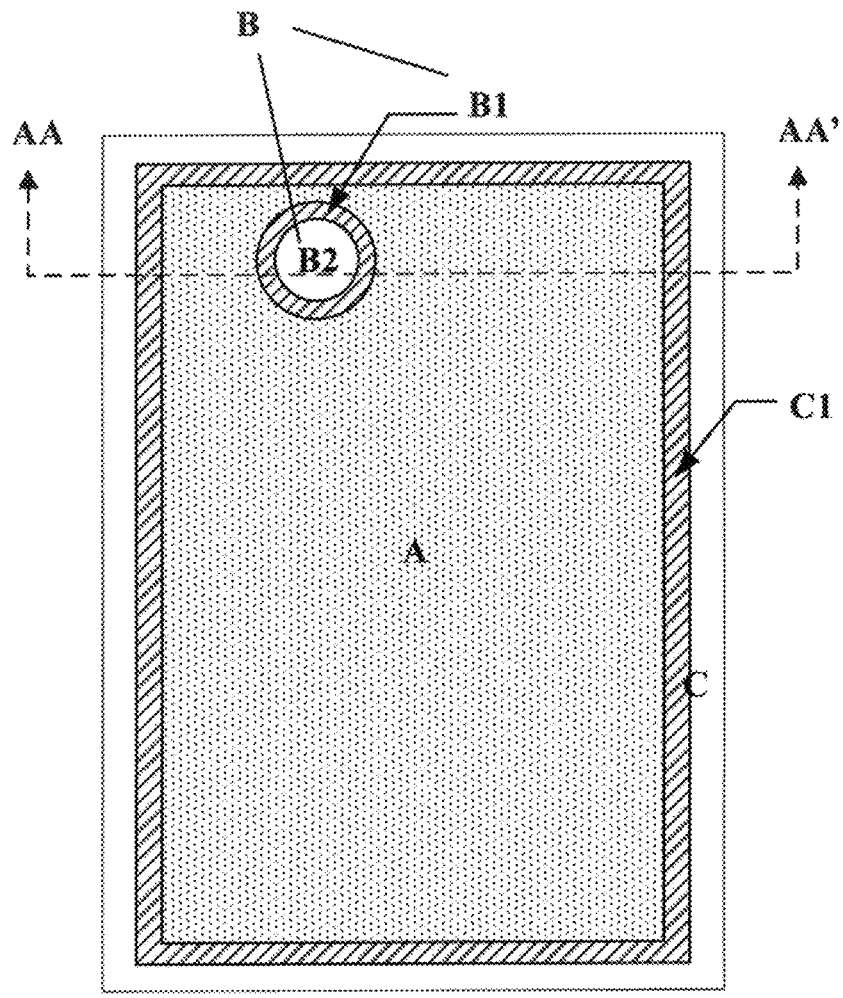
FIG. 1B is a schematic diagram illustrating the structure of a display panel in some embodiments according to the present disclosure.

FIG. 1B is a schematic diagram illustrating the structure of a display panel in some embodiments according to the present disclosure. Referring to FIG. 1B, the display panel in some embodiments has a display area A and a component installation area B, the component installation area B substantially surrounded by the display area A. In some embodiments, the component installation area B includes a first region B1 and a second region B2. Optionally, the second region B2 is substantially surrounded by the first region B1. Optionally, the first region B1 has a ring shape, e.g., a round ring like a doughnut, or a ring formed of a square, triangle or another shape with a hole here-through. Optionally, the second region B2 can display image. Typically, the second region B2 does not display image.

Figure 2:
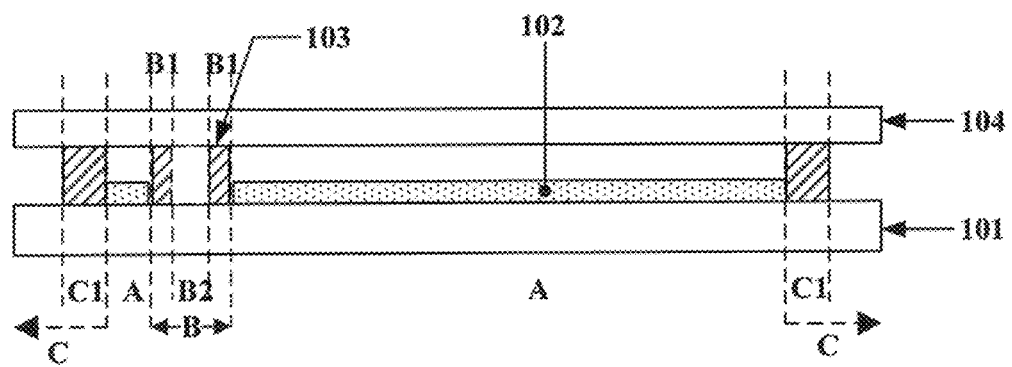
FIG. 2 is a cross-section view along AA-AA' line in FIG. 1B in some embodiments according to the present disclosure.

FIG. 2 is a cross-section view along AA-AA' line in FIG. 1B in some embodiments according to the present disclosure. Referring to FIG. 2, the display panel in some embodiments includes a base substrate 101, one or more organic layers 102 on the base substrate and in at least the display area A, and an encapsulating layer in at least a first region B1 of the component installation area B. The one or more organic layers 102 includes a light emitting layer.

In some embodiments, the display panel is an organic light emitting diode display panel. Optionally, the one or more organic layers 102 includes an organic light emitting layer. Optionally, the one or more organic layers 102 further includes a carrier transport layer such as a hole transport layer and an electron transport layer. Optionally, the one or more organic layers 102 further includes a carrier injection layer such as a hole injection layer and an electron injection layer.

In some embodiments, the one or more organic layers 102 is substantially outside the first region B1. For example, an orthographic projection of the one or more organic layers 102 on the base substrate 101 is substantially non-overlapping with an orthographic projection of the encapsulating layer 103 on the base substrate 101. Optionally, the encapsulating layer 103 has a thickness equal to or greater than a combined thickness of the one or more organic layers 102.

Figure 3:
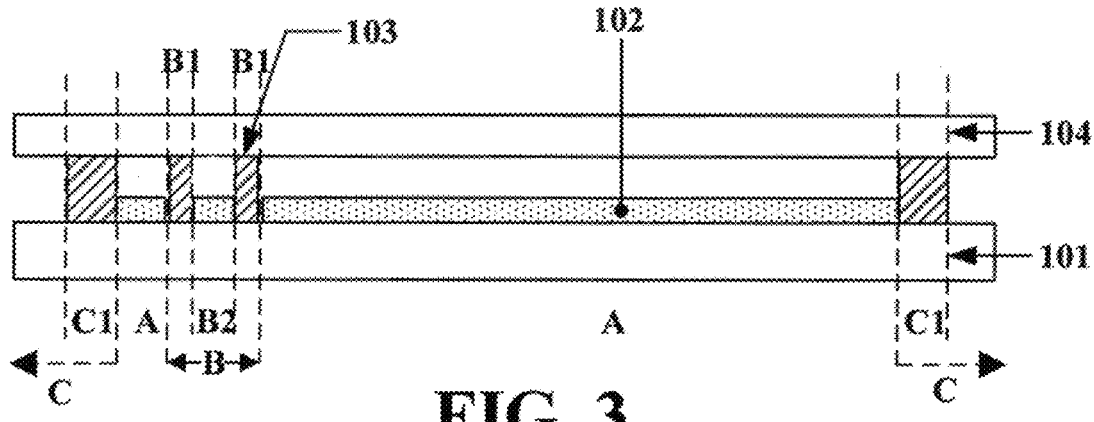
FIG. 3 is a cross-section view along AA-AA' line in FIG. 1B in some embodiments according to the present disclosure.

In some embodiments, the one or more organic layers 102 is in at least the display area A. Referring to FIG. 2, the one or more organic layers 102 is limited to the display area A. FIG. 3 is a cross-section view along AA-AA' line in FIG. 1B in some embodiments according to the present disclosure. Referring to FIG. 3, the one or more organic layers 102 is in the display area A as well as in the second region B2 of the component installation area B.

In some embodiments, and referring to FIG. 1A, FIG. 1B, FIG. 2, and FIG. 3, the encapsulating layer 103 is in the first region B1 of the component installation area B and in a peripheral area C surrounding the display area, thereby encapsulating the display area A. Referring to FIG. 2, in some embodiments, the encapsulating layer 103 is in the first region B1 of the component installation area B and in the C1 region of the peripheral area C. The C1 region substantially surrounds the display area A. The encapsulating layer 103 in the first region B1 and the C1 region encapsulates the display area A. Optionally, the encapsulating layer 103 is absent in the second region B2.

In some embodiments, and referring to FIG. 2 and FIG. 3, the display panel further includes an encapsulating substrate 104 on a side of the one or more organic layers 102 away from the base substrate 101. The encapsulating layer 103 in the first region B1 and the C1 region, and the encapsulating substrate 104 form an encapsulating structure, which together with the base substrate 101 form a sealed space encapsulating the one or more organic layers 102 inside the sealed space. The encapsulating structure prevents external oxygen and moisture from entering the display area A, extending the life time of the one or more organic layers in the display area A. Optionally, the encapsulating substrate 104 is a substantially transparent substrate.

Optionally, the encapsulating substrate 104 is hollowed out in the second region B2, and a component is installed in the second region B2.

In the present display panel, the one or more organic layers 102 are substantially outside the first region B1, e.g., the orthographic projection of the one or more organic layers 102 on the base substrate 101 is substantially non-overlapping with the orthographic projection of the encapsulating layer 103 on the base substrate 101. When the encapsulating layer 103 is cured, e.g., by a laser, the one or more organic layers 102 will not be decomposed (e.g., to produce moisture and carbon dioxide) because they are outside the first region B 1. Thus, the present display panel obviates the issue of encapsulating moisture and carbon dioxide inside the display area, significantly extending life time of the one or more organic layers 102.

The second region B2 may have any appropriate shape and any appropriate dimension, depending on design needs. Optionally, the second region B2 has a round shape. Optionally, the second region B2 has a rectangular shape.

Figure 4:
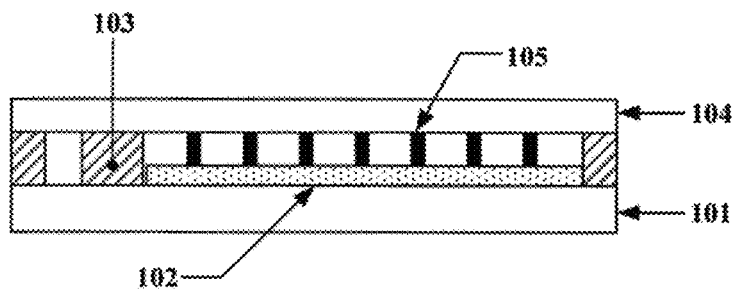
FIG. 4 is a schematic diagram illustrating the structure of a display panel in some embodiments according to the present disclosure.

FIG. 4 is a schematic diagram illustrating the structure of a display panel in some embodiments according to the present disclosure. Referring to FIG. 4, in some embodiments, the encapsulating layer 103 has a thickness greater than a combined thickness of the one or more organic layers 102. In some embodiments, the display panel further includes one or more spacers 105 on a side of the one or more organic layers 102 away from the base substrate 101, spacing apart the encapsulating substrate 104 and the base substrate 101. Optionally, a combined thickness of the one or more spacers 105 and the one or more organic layers 102 is substantially the same as the thickness of the encapsulating layer 103.

The one or more spacers 105 provide support for the encapsulating substrate 103, preventing deformation of the encapsulating substrate 103 under stress, and maintaining structural integrity of the display panel. In some embodiments, the one or more spacers 105 are disposed in an inter-subpixel region of the display panel. As used herein, an inter-subpixel region refers to a region between adjacent subpixel regions, such as a region corresponding to a black matrix in a liquid crystal display, a region corresponding to a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels.

In some embodiments, the one or more spacers 105 are made of a substantially non-transparent material. Optionally, the one or more spacers 105 function as a light shield for preventing light interference between adjacent subpixels.

In some embodiments, the encapsulating layer 103 is made of a substantially non-transparent glass frit. Optionally, the encapsulating layer 103 prevents light leakage from a lateral side of the display panel. As used herein, the term "substantially non-transparent" means at least 50 percent (e.g., at least 60 percent, at least 70 percent, at least 80 percent, at least 90 percent, and at least 95 percent) of light in the visible wavelength range not transmitted therethrough.

Optionally, the encapsulating substrate 104 is a glass substrate.

Figure 5:
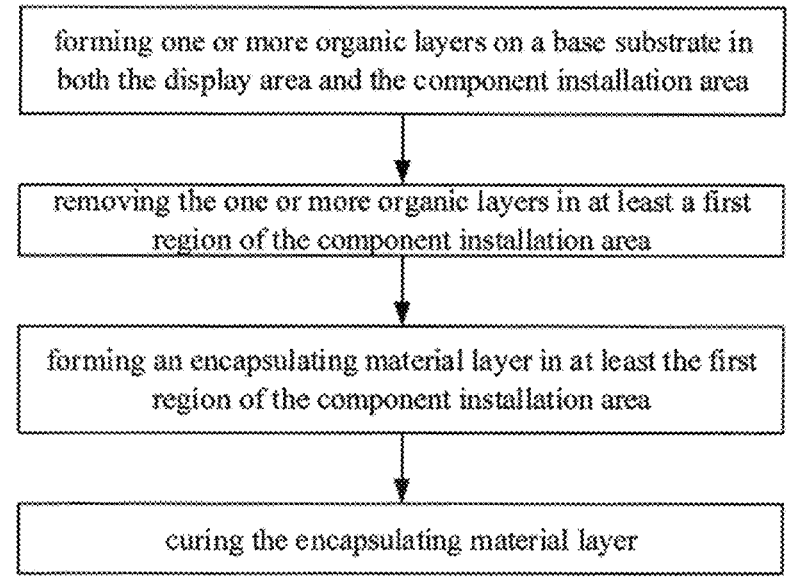
FIG. 5 is a flow chart illustrating a process of fabricating a display panel in some embodiments according to the present disclosure.

In another aspect, the present disclosure provides a method of fabricating a display panel having a display area and a component installation area substantially surrounded by the display area. FIG. 5 is a flow chart illustrating a process of fabricating a display panel in some embodiments according to the present disclosure. Referring to FIG. 5, the method in some embodiments includes forming one or more organic layers on a base substrate in both the display area and the component installation area; removing the one or more organic layers in at least a first region of the component installation area; forming an encapsulating material layer in at least the first region of the component installation area; and curing the encapsulating material layer. In the present method, subsequent to forming the one or more organic layers on the base substrate in both the display area and the component installation area, the one or more organic layers are substantially removed from the first region. The encapsulating material layer is then formed in the first region. When the encapsulating material layer is cured, e.g., by a laser, the one or more organic layers will not be decomposed (e.g., to produce moisture and carbon dioxide) because they are outside the first region. Thus, the present method obviates the issue of encapsulating moisture and carbon dioxide inside the display area, significantly extending life time of the one or more organic layers.

Figure 6:
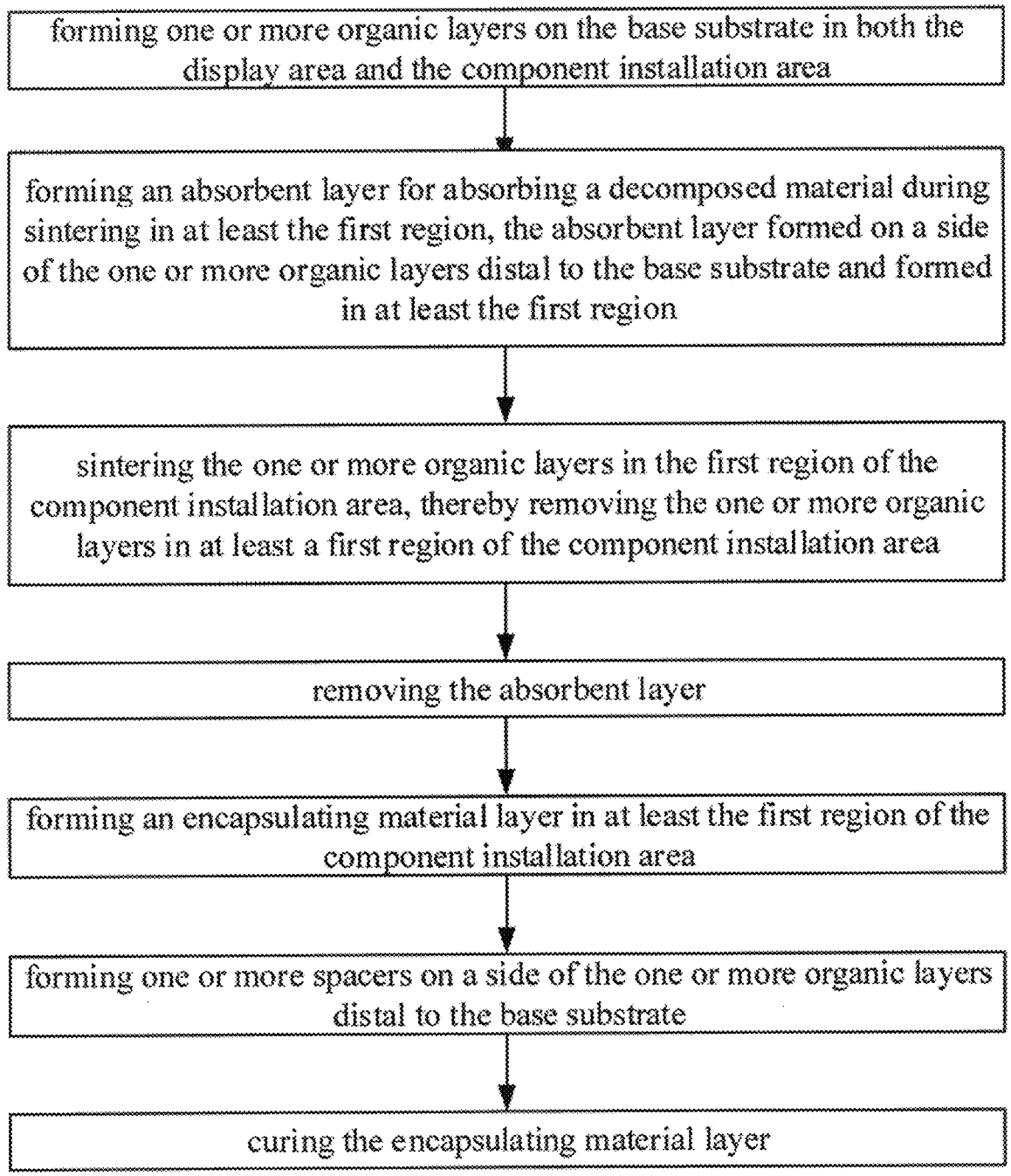
FIG. 6 is a flow chart illustrating a process of fabricating a display panel in some embodiments according to the present disclosure.

FIG. 6 is a flow chart illustrating a process of fabricating a display panel in some embodiments according to the present disclosure. Referring to FIG. 6, the method in some embodiments includes forming one or more organic layers on the base substrate in both the display area and the component installation area; forming an absorbent layer for absorbing a decomposed material during sintering in at least the first region, the absorbent layer formed on a side of the one or more organic layers away from the base substrate and formed in at least the first region; sintering the one or more organic layers in the first region of the component installation area, thereby removing the one or more organic layers in at least a first region of the component installation area; removing the absorbent layer; forming an encapsulating material layer in at least the first region of the component installation area; forming one or more spacers on a side of the one or more organic layers away from the base substrate, and curing the encapsulating material layer.

Various appropriate materials and various appropriate fabricating methods may be used for making the base substrate. Examples of materials suitable for making the base substrate include, but are not limited to, glass, quartz, polyimide, and polyester, etc.

In some embodiments, the step of forming the one or more organic layers includes forming a light emitting layer. Optionally, the step of forming the one or more organic layers includes forming an organic light emitting layer. Optionally, the step of forming the one or more organic layers further includes forming a carrier transport layer such as a hole transport layer and an electron transport layer. Optionally, the step of forming the one or mom organic layers further includes forming a carrier injection layer such as a hole injection layer and an electron injection layer.

In some embodiments, the base substrate is a thin film transistor array substrate. In some embodiments, prior to forming the one or more organic layers on the base substrate, the method further includes forming a plurality of thin film transistors. Optionally, the method further includes forming a plurality of first electrode (e.g., a plurality of anodes for the one or more light emitting elements) prior to forming the one or more organic layers on the base substrate.

In some embodiments, subsequent to forming the one or more organic layers on the base substrate, the method further includes forming a second electrode (e.g., a cathode for the one or more light emitting elements).

In some embodiments, the absorbent layer is a layer for absorbing moisture and carbon dioxide generated during a sintering process of the one or more organic layers. Optionally, the absorbent layer is formed by mechanically pasting a layer of absorbent material on a side of the one or more organic layers away from the base substrate in an inert atmosphere. Optionally, the inert atmosphere is a nitrogen atmosphere. By forming the absorbent layer in the inert atmosphere, its capacity for absorbing the decomposed material can be preserved to a greater extent. For example, it can be avoided that the absorbent layer absorbs carbon dioxide and moisture in air.

Figure 7:
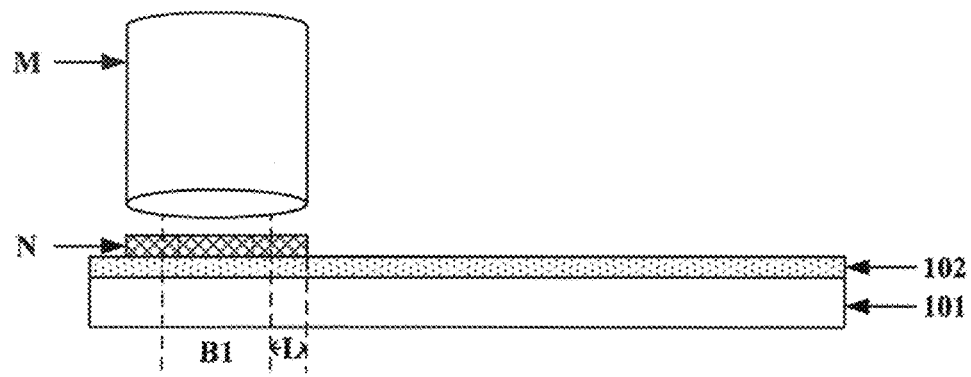
FIG. 7 illustrates a process of forming an absorbent layer in some embodiments according to the present disclosure.

FIG. 7 illustrates a process of forming an absorbent layer in some embodiments according to the present disclosure. Referring to FIG. 7, a mechanical pasting post M approaches to a side of the one or more organic layers 102 away from the base substrate 101, and pastes an absorbent layer N on a side of the one or more organic layers 102 away from the base substrate 101. The absorbent layer N is formed in at least the first region B1.

In some embodiments, the component installation area includes the first region B1 and a second region substantially surrounded by the first region B1. Optionally, the absorbent layer N is formed in both the first region B1 and the second region. By having this design, the absorbent layer N can absorb the moisture and carbon dioxide generated during the sintering process more effectively. Optionally, the absorbent layer N is formed only in the first region B1 but not in the second region.

In some embodiments, the absorbent layer N has a margin greater than 500 μm with respect to the first region B1. For example, referring to FIG. 7, the absorbent layer N can be made wider than the first region B1 on both sides by a margin L greater than 500 μm.

In some embodiments, the absorbent layer N includes a material that absorbs moisture and carbon dioxide, and resistant to the sintering process (e.g., resistant to laser irradiation). Optionally, the absorbent layer N includes calcium oxide. Optionally, the absorbent layer N includes a mixture of calcium oxide, silicon dioxide, and silicon nitride. Optionally, the absorbent layer N is made by dispersing calcium oxide into a matrix including one or a combination of silicon dioxide and silicon nitride.

In some embodiments, the absorbent layer N has a thickness in a range of approximately 300 μm to approximately 500 μm, e.g., approximately 300 μm to approximately 350 μm, approximately 350 μm to approximately 400 μm, approximately 400 μm to approximately 450 μm, and approximately 450 μm to approximately 500 μm. By having a thickness in this range, the absorbent layer N has sufficient amount of material for absorbing the moisture and carbon dioxide, and it is also easy to be removed subsequently.

In some embodiments, the sintering process is performed by laser sintering. Optionally, the laser sintering may be performed using a femtosecond laser generator. Optionally, the laser sintering may be performed using a nanosecond laser generator. Optionally, the laser irradiates the one or more organic layers from a side away from the base substrate, sintering the one or more organic layers. Due to the high energy potential of the laser, the one or more organic layers in regions adjacent to the first region may also be sintered during the process. Accordingly, by making the absorbent layer to have a margin greater than 500 μm with respect to the first region, the decomposed material generated during the sintering process can be effectively absorbed.

Figure 8:
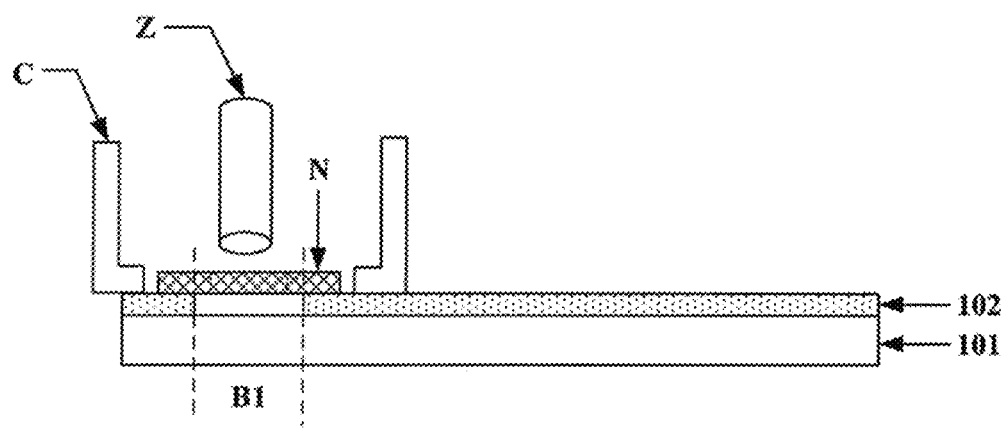
FIG. 8 illustrates a process of removing an absorbent layer in some embodiments according to the present disclosure.

FIG. 8 illustrates a process of removing an absorbent layer in some embodiments according to the present disclosure. Referring to FIG. 8, an air blower C and a vacuum suction equipment Z are used in the process of the absorbent layer N, subsequent to sintering the one or more organic layers in the first region B1 of the component installation area. In some embodiments, the step of removing the absorbent layer includes dislodging the absorbent layer N by applying a flow of an insert gas from the air blower C toward one or more lateral sides of the absorbent layer N, and removing dislodged absorbent material of the absorbent layer N by applying a vacuum suction on top of the absorbent layer N using the vacuum suction equipment Z.

Optionally, the encapsulating material layer is formed to have a thickness equal to or greater than a combined thickness of the one or more organic layers.

In some embodiments, the encapsulating material layer is formed on an encapsulating substrate. Optionally, the encapsulating material layer is formed on the encapsulating substrate in regions corresponding to the first region and a peripheral area surrounding the display area. The encapsulating substrate is then assembled with the base substrate from a side of the one or more organic layers away from the base substrate. Optionally, the encapsulating material layer is absent in the second region.

In some embodiments, the encapsulating material layer is made of a substantially non-transparent glass frit. Optionally, the encapsulating material layer prevents light leakage from a lateral side of the display panel.

Optionally, the encapsulating substrate is a glass substrate.

In some embodiments, the encapsulating material layer is to have a thickness greater than the combined thickness of the one or more organic layers. Optionally, the method further includes forming one or more spacers on a side of the one or more organic layers away from the base substrate. Optionally, the one or more spacers are formed so that a combined thickness of the one or more spacers and the one or more organic layers is substantially the same as the thickness of the encapsulating material layer.

The one or more spacers may be formed by various appropriate methods. In one example, the one or more spacers are formed by a lithographic process including forming a photoresist layer, exposure and development, etching, and photoresist removal. The one or more spacers are formed to provide support for the encapsulating substrate, preventing deformation of the encapsulating substrate under stress, and maintaining structural integrity of the display panel. In some embodiments, the one or more spacers are formed in an inter-subpixel region of the display panel. In some embodiments, the one or more spacers are made of a substantially non-transparent material. Optionally, the one or more spacers function as a light shield for preventing light interference between adjacent subpixels.

In some embodiments, the curing process is performed by laser curing. Optionally, the laser curing may be performed using a femtosecond laser generator. Optionally, the laser curing may be performed using a nanosecond laser generator. Optionally, the laser irradiates the encapsulating material layer from a side away from the base substrate, thereby forming an encapsulating layer.

In some embodiments, the step of forming the one or more organic layers is performed using an open mask process. For example, organic materials are deposited onto the entire base substrate without using a mask plate. Thus, initially the one or more organic layers are formed not only in the display area, but also in the component installation area.

In another aspect, the present disclosure provides a display apparatus. In some embodiments, the display apparatus includes a display panel described herein or fabricated by a method described herein. Optionally, the display apparatus further includes one or more integrated circuits. Optionally, the display apparatus is an organic light emitting diode display apparatus. Optionally, the display apparatus is a quantum dots light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display panel having a display area and a component installation area substantially surrounded by the display area, comprising:
    forming one or more organic layers on a base substrate in both the display area and the component installation area;
    removing the one or more organic layers in at least a first region of the component installation area;
    forming an encapsulating material layer in at least the first region of the component installation area; and
    curing the encapsulating material layer;
    wherein removing the one or more organic layers in at least a first region of the component installation area comprises sintering the one or more organic layers in the first region of the component installation area
    wherein the method further comprises:
    prior to sintering the one or more organic layers in the first region of the component installation area, forming an absorbent layer for absorbing a decomposed material during sintering in at least the first region, the absorbent layer formed on a side of the one or more organic layers away from the base substrate and formed in at least the first region; and
    subsequent to sintering the one or more organic layers in the first region of the component installation area, further comprising removing the absorbent layer.

2. The method of claim 1, wherein the encapsulating material layer is formed in the first region of the component installation area and in a peripheral area surrounding the display area; and
    the encapsulating material layer is cured to form an encapsulating layer encapsulating the display area.

3. The method of claim 1, wherein curing the encapsulating material layer is performed by laser curing.

4. The method of claim 1, wherein the component installation area comprises the first region and a second region substantially surrounded by the first region; and
the encapsulating material layer is absent in the second region.

5. The method of claim 1, wherein sintering the one or more organic layers in the first region of the component installation area is performed by laser sintering.

6. The method of claim 1, wherein the absorbent layer is formed by mechanically pasting a layer of absorbent material on a side of the one or more organic layers away from the base substrate in an inert atmosphere.

7. The method of claim 1, wherein removing the absorbent layer comprises:
dislodging the absorbent layer by applying a flow of an insert gas toward one or more lateral sides of the absorbent layer; and
removing dislodged absorbent material of the absorbent layer by applying a vacuum suction on top of the absorbent layer.

8. The method of claim 1, wherein the absorbent layer comprises calcium oxide.

9. The method of claim 1, wherein the absorbent layer has a margin greater than 500 µm with respect to the first region.

10. The method of claim 1, wherein the absorbent layer has a thickness in a range of approximately 300 µm to approximately 500 µm.

11. The method of claim 1, wherein forming the encapsulating material layer in at least the first region of the component installation area comprises:
forming the encapsulating material layer on an encapsulating substrate; and
assembling the encapsulating substrate with the base substrate from a side of the one or more organic layers away from the base substrate.

12. The method of claim 11, further comprising forming one or more spacers on a side of the one or more organic layers away from the base substrate.

* * * * *